United States Patent
Kuo et al.

(10) Patent No.: US 8,112,058 B2
(45) Date of Patent: Feb. 7, 2012

(54) MINIATURIZED DUAL-BALANCED MIXER CIRCUIT BASED ON A DOUBLE SPIRAL LAYOUT ARCHITECTURE

(75) Inventors: Che-Chung Kuo, Taipei (TW); Huei Wang, Taipei (TW)

(73) Assignee: National Taiwan University, Taipei (TW)

( * ) Notice: Subject to any disclaimer, the term of this patent is extended or adjusted under 35 U.S.C. 154(b) by 340 days.

(21) Appl. No.: 12/391,622

(22) Filed: Feb. 24, 2009

(65) Prior Publication Data

US 2010/0079189 A1    Apr. 1, 2010

(30) Foreign Application Priority Data

Sep. 30, 2008    (TW) .............................. 97137431 A

(51) Int. Cl.
*H04B 1/26* (2006.01)
(52) U.S. Cl. ......... 455/326; 455/323; 455/333; 327/355
(58) Field of Classification Search .................. 455/131, 455/313, 323, 326, 333; 327/113, 355
See application file for complete search history.

(56) References Cited

U.S. PATENT DOCUMENTS 5,390,349 A * 2/1995 Joshi et al. .................... 455/330
6,807,407 B2 * 10/2004 Ji ................................... 455/326
2010/0079223 A1 * 4/2010 Kuo et al. .................... 333/24 R
2010/0081409 A1 * 4/2010 Kuo et al. ..................... 455/326

OTHER PUBLICATIONS

Che-Chung Kuo et al.; "Novel Miniature and Broadband Millimeter-Wave Monolithic Star Mixers"; IEEE Transactions on Microwave Theory and Techniques; Vo. 56, No. 4, Apr. 2008; pp. 793-802.*
Che-Chung Kuo et al.; "Novel Miniature and Broadband Millimeter-Wave Monolithic Star Mixers"; IEEE Transactions of Microwave Theory and Techniques; vol. 56, No. 4, Apr. 2008; pp. 793-802.

* cited by examiner

*Primary Examiner* — Long Nguyen
(74) *Attorney, Agent, or Firm* — Peter F. Corless; Steven M. Jensen; Edwards Wildman Palmer LLP

(57) ABSTRACT

A miniaturized dual-balanced mixer circuit based on a double spiral layout architecture is proposed, which is designed for use to provide a frequency mixing function for millimeter wave (MMW) signals, and which features a downsized circuit layout architecture that allows IC implementation to be more miniaturized than the conventional star-type dual-balanced mixer (DBM). The proposed miniaturized dual-balanced mixer circuit is distinguished from the conventional star-type DBM particularly in the use of a double spiral layout architecture for the layout of two balun circuit units. This feature allows the required layout area to be only about 15% of that of the conventional star-type DBM.

22 Claims, 7 Drawing Sheets

MINIATURIZED DUAL-BALANCED MIXER CIRCUIT BASED ON A DOUBLE SPIRAL LAYOUT ARCHITECTURE

BACKGROUND OF THE INVENTION

1. Field of the Invention

This invention relates to a miniaturized dual-balanced mixer circuit which is fully equivalent in function to a conventional star-type dual-balanced mixer (DBM) for frequency mixing of millimeter wave (MMW) signals, except that the construction of the invention is based on a double spiral layout architecture that allows its IC implementation to be more miniaturized than the conventional star-type DBM.

2. Description of Related Art

In communications systems, the mixer is an essential circuit component which receives an input of a carrier signal RF and mixes it with a local oscillation signal LO to thereby produce an intermediate-frequency signal IF, where IF is either an up-converted frequency or a down-converted frequency, i.e., IF=RF+LO or IF=RF−LO.

In millimeter wave (MMW) communications systems, the dual-balanced mixer (DBM) is a widely utilized frequency mixing circuit. Various types of DBM circuits have been proposed, including a ring-type and a star-type. The star-type DBM has better performance than the ring-type so that it is more widely utilized in the industry than the ring-type. The star-type DBM is so named due to the fact that the layout pattering of the microstrip lines used to constitute the mixer circuitry looks like a star.

In practical applications, however, one drawback of the conventional star-type DBM is that it is based on a dual-balun circuit architecture which is considerably large in size in IC implementation so that it is unsuitable for use in the fabrication of miniaturized IC chips.

SUMMARY OF THE INVENTION

It is therefore an objective of this invention to provide a miniaturized dual-balanced mixer circuit which is constructed on a double spiral layout architecture that allows its IC implementation to have a reduced layout space compared to the conventional star-type DBM for fabrication of miniaturized IC chips.

In architecture, the miniaturized dual-balanced mixer circuit according to the invention comprises: (A) a first balun circuit unit; (B) a second balun circuit unit; and (C) a frequency-mixing circuit unit.

The miniaturized dual-balanced mixer circuit of the invention is distinguished from the conventional star-type DBM particularly in that the invention utilizes two balun circuit units that are constructed on a multilayer substrate having at least 2 layers for the layout of a plurality of distributed transmission lines in such a manner as to form a dual Marchand balun circuit architecture whose layout pattern is based on a double spiral topology.

Compared to the conventional star-type DBM, the miniaturized dual-balanced mixer circuit of the invention is more advantageous to use in that the invention can be implemented in IC fabrication with a reduced layout space compared to the conventional star-type DBM owing to the use of a double spiral layout architecture for the layout of the 2 balun circuit units. Specifically speaking, the invention only requires a layout area of about 15% of that of the conventional star-type DBM.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The miniaturized dual-balanced mixer circuit based on a double spiral layout architecture according to the invention is disclosed in full details by way of preferred embodiments in the following with reference to the accompanying drawings.

Function of the Invention

Figure 1:
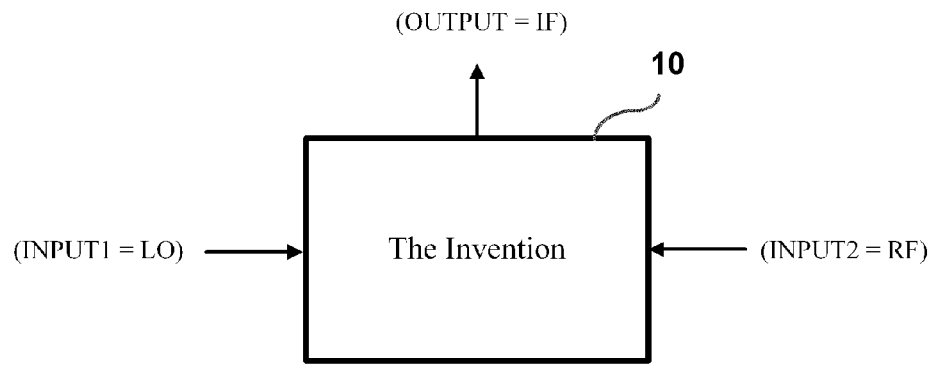
FIG. 1 is a schematic diagram showing the I/O functional model of the invention.

FIG. 1 shows the I/O (input/output) functional model of the miniaturized dual-balanced mixer circuit of the invention 10. As shown, the miniaturized dual-balanced mixer circuit of the invention 10 is used for processing an input of a high-frequency signal, such as a millimeter-wave (MMW) carrier signal RF, by mixing it with a local oscillation signal LO to thereby produce an intermediate-frequency signal IF, where IF is either a down-converted frequency, i.e., IF=RF−LO, or an up-converted frequency, i.e., IF=RF+LO. This I/O relationship is the same as conventional types of mixers.

Architecture of the Invention

Figure 2:
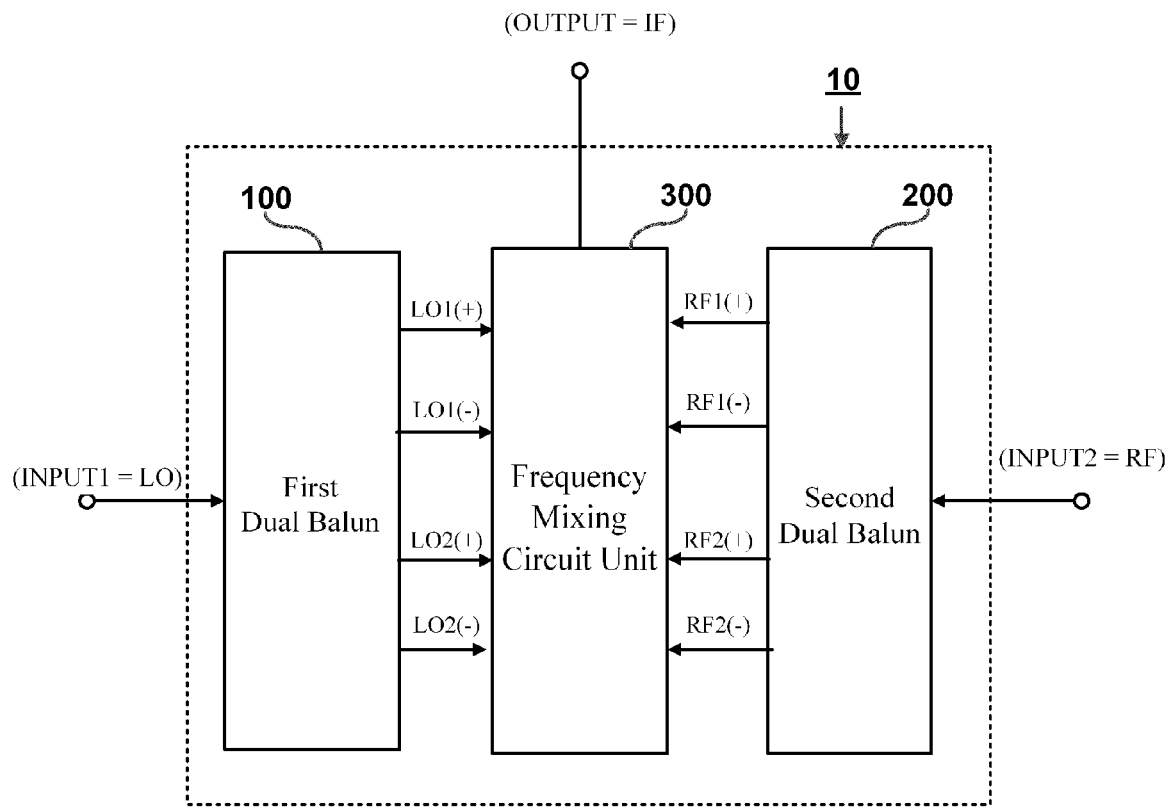
FIG. 2 is a schematic diagram showing the circuit architecture of the invention.

Referring further to FIG. 2, in architecture, the miniaturized dual-balanced mixer circuit of the invention 10 comprises: (A) a first balun circuit unit 100; (B) a second balun circuit unit 200; and (C) a frequency-mixing circuit unit 300. Firstly, the respective attributes and functions of these constituent circuit components of the invention are described in details in the following.

(A) First Balun Circuit Unit 100

The first balun circuit unit 100 has an I/O interface including one input port LO and four output ports: a first output port LO1(+), a second output port LO1(−), a third output port LO2(+), and a fourth output port LO2(−). In operation, the input port LO is used for reception of the local oscillation signal LO while the four output ports are used respectively for outputting four balance-to-unbalance transformed signals [LO1(+), LO1(−), LO2(+), LO2(−)], where the first pair of output signals [LO1(+), LO1(−)] are a pair of differential signals with a phase difference of 180 degrees, while the second pair of output signals [LO2(+), LO2(−)] are also a pair of differential signals with a phase difference of 180 degrees.

Figure 3A:
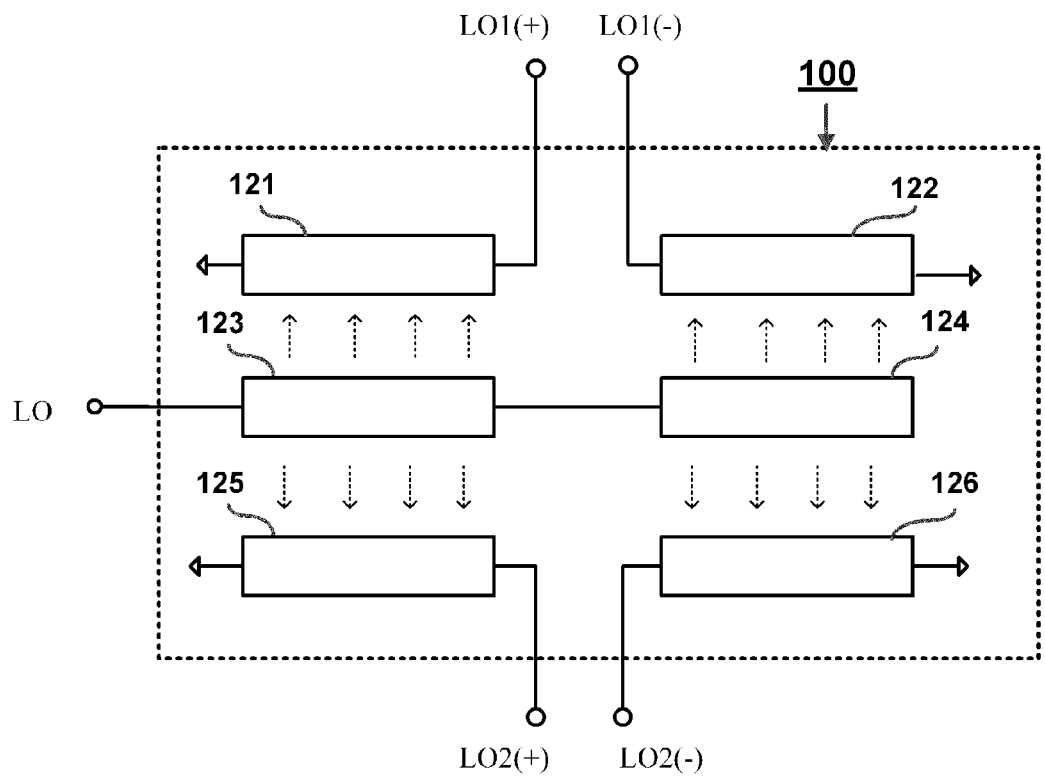
FIG. 3A is a schematic diagram showing the circuit architecture of a first balun circuit unit utilized by the invention as a circuit component.
Figure 4A:
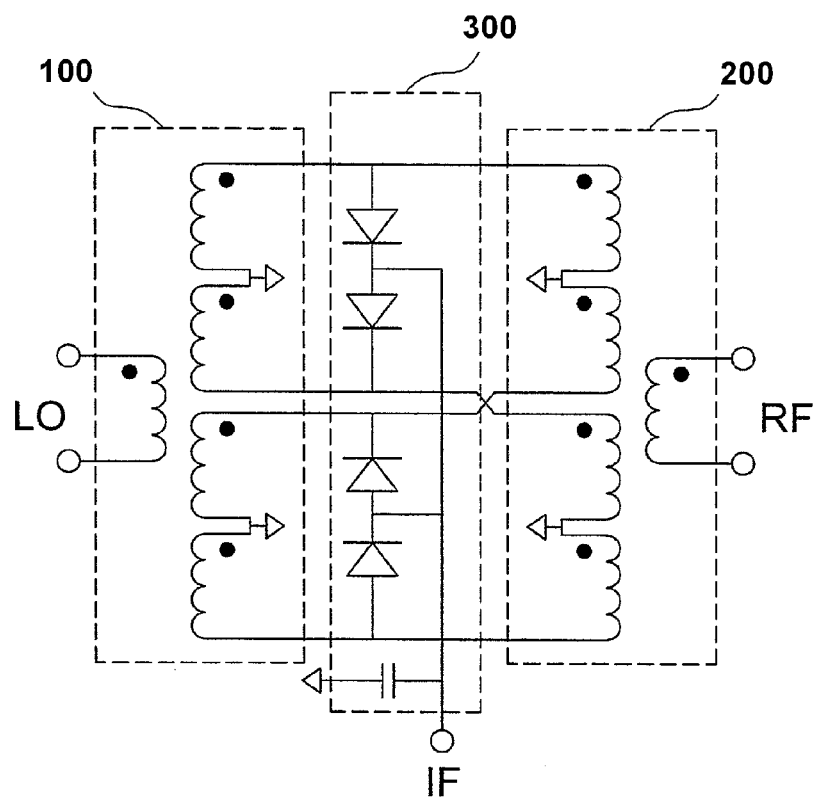
FIG. 4A is a schematic diagram showing the equivalent circuit of a first embodiment of the invention based on a diode-switched type of frequency-mixing circuit unit.

In practice, the first balun circuit unit 100 is based on a circuit architecture shown in FIG. 3A which includes 6 distributed transmission lines, including a first transmission line 121, a second transmission line 122, a third transmission line 123, a fourth transmission line 124, a fifth transmission line 125, and a sixth transmission line 126. These transmission lines (121, 122, 123, 124, 125, 126) are each implemented with a quarter-wavelength (λ/4) microstrip line, and which are arranged to constitute a dual Marchand balun circuit architecture whose equivalent circuit is shown in FIG. 4A. Since the dual Marchand balun circuit architecture is a well-known circuit technology in the field and industry of electronics, detailed description thereof will not be given in this specification It is an important aspect of the invention that in IC realization the first balun circuit unit 100 is implemented with a double spiral layout architecture shown in FIGS. 5A-5B. As shown, this double spiral layout architecture is based on a multilayer substrate 110 (which is for example a 2-layer substrate in this embodiment) for layout of the six transmission lines (121, 122, 123, 124, 125, 126). As illustrated in FIG. 5B, the multilayer substrate 110 includes at least 2 circuit layout planes: a first circuit layout plane 111 and a second circuit layout plane 112, and further includes a grounding plane 113. In practice, for example, the multilayer substrate 110 can be implemented with a commercially-standardized double-layer GaAs substrate specifically used for 0.15 μm (micrometer) pHEMT (pseudomorphic HEMT, where HEMT=High Electron Mobility Transistor) fabrication processes.

Figure 5A:
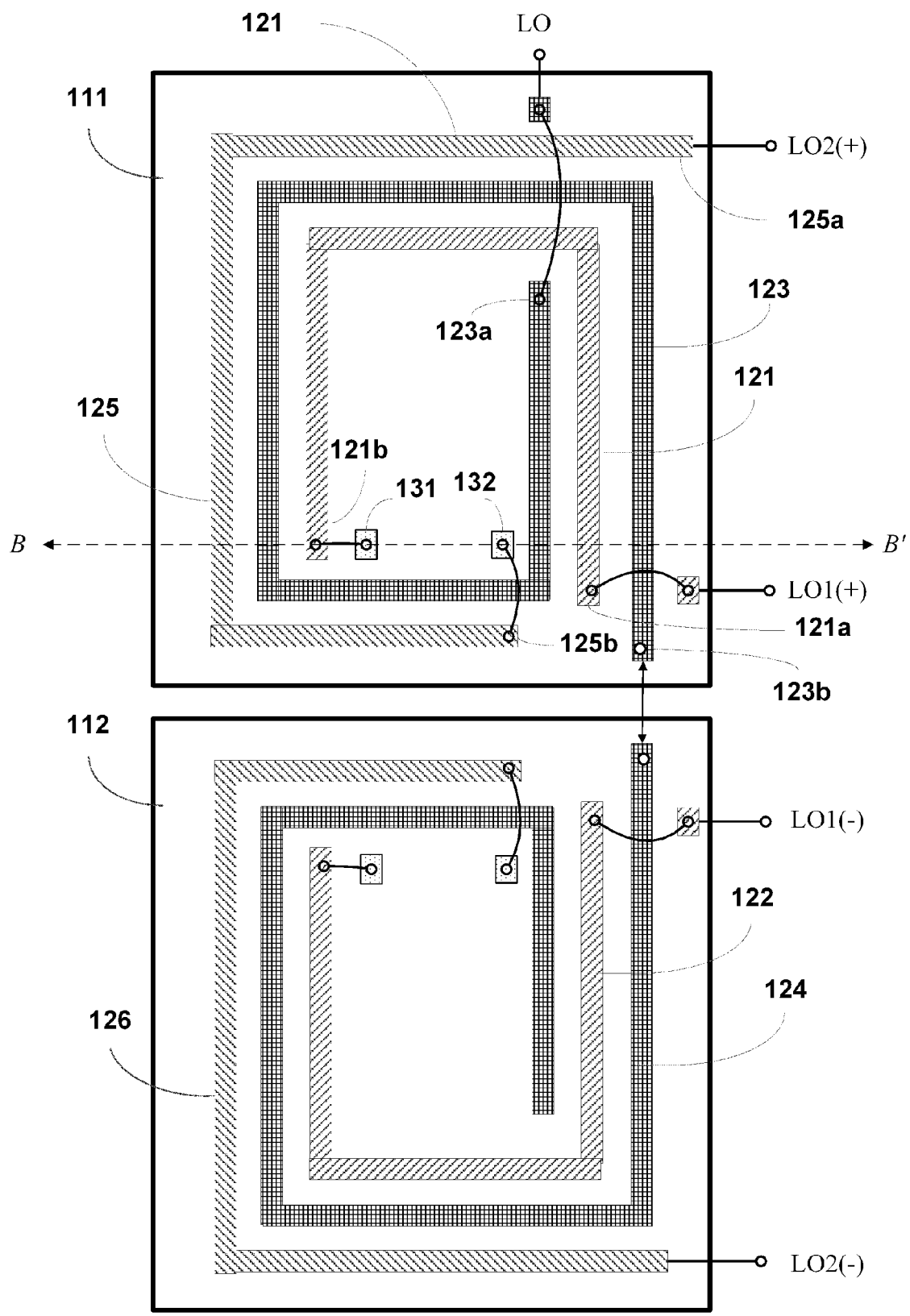
FIG. 5A is a schematic diagram showing a plan view of a double spiral layout architecture utilized by the invention for implementing each balun circuit unit.
Figure 5B:
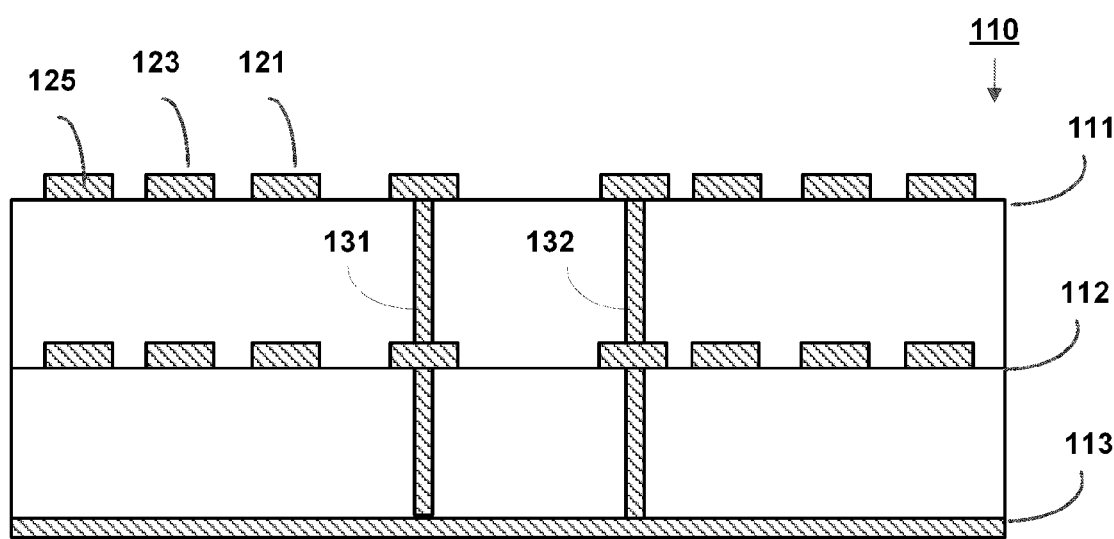
FIG. 5B is a schematic diagram showing a sectional view of the double spiral layout architecture shown in FIG. 5A.

As illustrated in FIG. 5A, on the multilayer substrate 110, the first circuit layout plane 111 is used for the layout of the three transmission lines (121, 123, 125) which are patterned in a spiral topology; and in a similar manner, the second circuit layout plane 112 is used for the layout of the other three transmission lines (122, 124, 126) which are also patterned in the same spiral topology. In other words, the first balun circuit unit 100 is constructed on a double spiral layout architecture.

On the first circuit layout plane 111, the third transmission line 123 is formed with 5 continuous straight segments patterned in a spiral shape, and which has a first terminal 123a connected by way of a bridging line to the input port of the local oscillation signal LO and a second terminal 123b connected to the fourth transmission line 124 on the second circuit layout plane 112. The first transmission line 121 is formed with 3 continuous straight segments patterned in a spiral manner into a U-like shape, and which has a first terminal 121a connected to the output port of the transformed signal LO1(+) and a second terminal 121b connected to a grounding via 131. Further, the fifth transmission line 125 is also formed with 3 continuous straight segments patterned also in a spiral manner into a U-like shape, and which has a first terminal 125a connected to the output port of the transformed signal LO2(+) and a second terminal 125b connected by way of a bridging line to a grounding via 132.

In the foregoing double spiral layout architecture, the first transmission line 121 and the fifth transmission line 125 are each a quarter-wavelength (λ/4) microstrip line, whereas the third transmission line 123 can have a length slightly longer than quarter-wavelength (λ/4). These three transmission lines (121, 123, 125) each has a line width W and a gap distance S. The first transmission line 121 and the fifth transmission line 125 extend on both sides along the third transmission line 123 to form a dual Marchand balun circuit architecture.

Similarly, on the second circuit layout plane 112, the other 3 transmission lines (122, 124, 126) are laid in the same double spiral pattern as the forgoing 3 transmission lines (121, 123, 125), so that details thereof will not be repeatedly described herein.

(B) Second Balun Circuit Unit 200

Figure 3B:
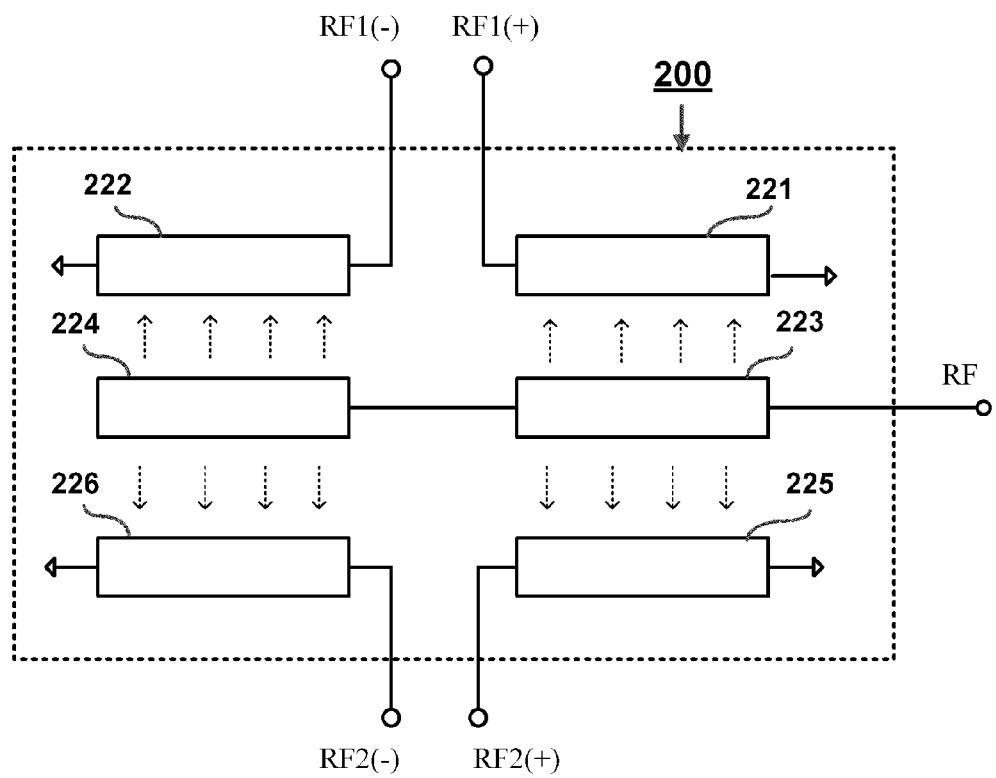
FIG. 3B is a schematic diagram showing the circuit architecture of a second balun circuit unit utilized by the invention as a circuit component.

The second balun circuit unit 200 is based on a circuit architecture shown in FIG. 3B, which is entirely identical to the circuit architecture of the first balun circuit unit 100 shown in FIG. 3A and described above. The second balun circuit unit 200 also has an I/O interface including one input port RF and four output ports: a first output port RF1(+), a second output port RF1(−), a third output port RF2(+), and a fourth output port RF2(−). In operation, the input port RF is used for reception of the carrier signal RF and the four output ports are used respectively for outputting four balance-to-unbalance transformed signals [RF1(+), RF1(−), RF2(+), RF2(−)], where the first pair of output signals [RF1(+), RF1(−)] are a pair of differential signals with a phase difference of 180 degrees, while the second pair of signals [RF2(+), RF2(−)] are also a pair of differential output signals with a phase difference of 180 degrees.

In circuit architecture, the second balun circuit unit 200 shown in FIG. 3B is also composed of 6 distributed transmission lines, including a first transmission line 221, a second transmission line 222, a third transmission line 223, a fourth transmission line 224, a fifth transmission line 225, and a sixth transmission line 226.

In IC implementation, these six transmission lines (221, 222, 223, 224, 225, 226) of the second balun circuit unit 200 are also constructed on the double spiral layout architecture shown in FIGS. 5A-5B. Since this second balun circuit unit 200 is entirely identical in architecture, function, and layout as the first balun circuit unit 100 described above, description thereof will not be repeated here.

(C) Frequency-Mixing Circuit Unit 300

The frequency-mixing circuit unit 300 is used to process the output signals [LO1(+), LO1(−), LO2(+), LO2(−)] and [RF1(+), RF1(−), RF2(+), RF2(−)] generated by the first balun circuit unit 100 and the second balun circuit unit 200 to thereby generate an intermediate-frequency signal IF.

In practice, the frequency-mixing circuit unit 300 can be realized in the following two embodiments: (C1) a diode-switched circuit architecture shown in FIG. 4A; and (C2) a transistor-switched circuit architecture shown in FIG. 4B.

(C1) Diode-Switched Type of Frequency-Mixing Circuit Unit 300

As shown in FIG. 4A, the first embodiment of the frequency-mixing circuit unit 300 is based on a diode-switched circuit architecture which is composed of 4 diodes arranged in a particular manner that allows the generation of the intermediate-frequency signal IF in response to [LO1(+), LO1(−), LO2(+), LO2(−)] and [RF1(+), RF1(−), RF2(+), RF2(−)]. This diode-switched circuit architecture is based on a conventional circuit arrangement used in conventional star-type DBM circuitry, so that detailed description thereof will not be given in this specification.

(C2) Transistor-Switched Type of Frequency-Mixing Circuit Unit 300

Figure 4B:
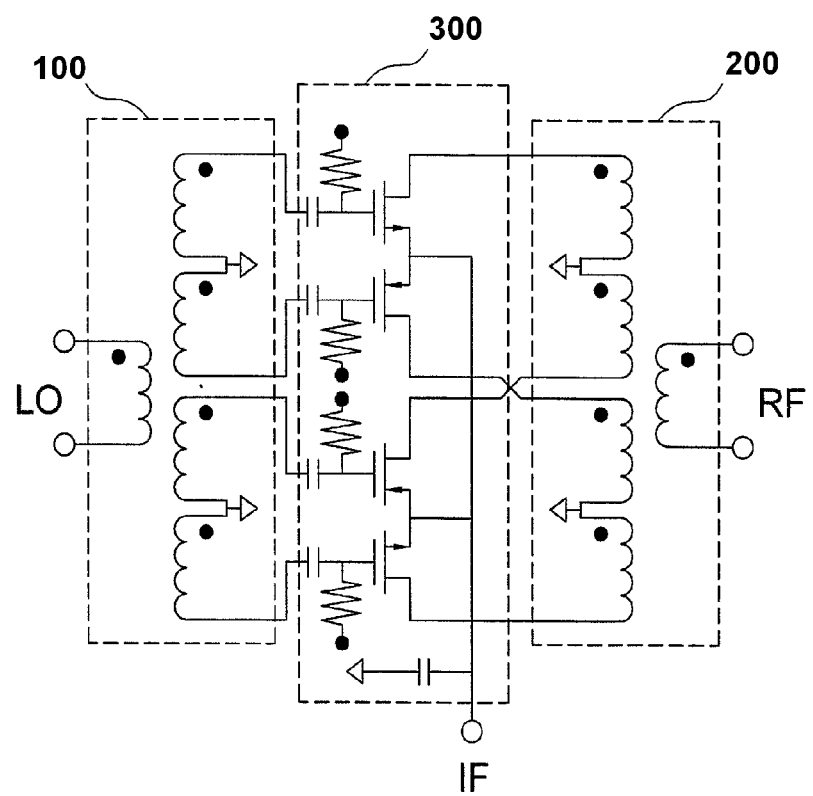
FIG. 4B is a schematic diagram showing the equivalent circuit of a second embodiment of the invention based on a transistor-switched type of frequency-mixing circuit unit.

As shown in FIG. 4B, the second embodiment of the frequency-mixing circuit unit 300 is based on a transistor-switched circuit architecture which is composed of 4 transistor-based circuit modules (each including a transistor, a resistor, and a capacitor) that are arranged in a particular manner to allow the generation of the intermediate-frequency signal IF in response to [LO1(+), LO1(−), LO2(+), LO2(−)] and [RF1(+), RF1(−), RF2(+), RF2(−)]. This transistor-switched circuit architecture is also based on a conventional circuit arrangement used in conventional star-type DBM circuitry, so that detailed description thereof will not be given in this specification.

Operating Characteristics Of The Invention

Figure 6A:
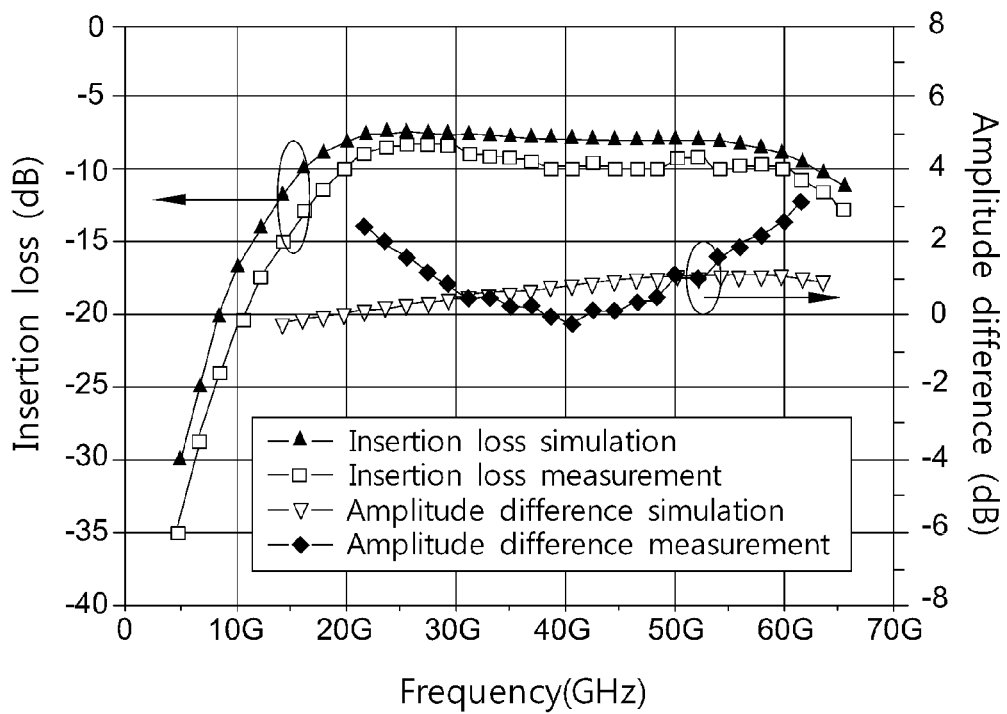
FIG. 6A is a graph showing the insertion loss versus RF characteristics of each balun circuit unit utilized by the invention.

FIG. 6A is a graph showing the insertion loss versus RF characteristics of each of the two balun circuit units (100, 200) resulted from both circuit simulation and actual testing. It can be seen from this graph that in the frequency range from 25 GHz to 58 GHz, the simulation result shows an insertion loss of about 8 dB, while the actual testing shows an insertion loss of about 8 dB to 10 dB. Moreover, the simulation result shows an amplitude difference of from 1 dB, while the actual testing shows an amplitude difference of 2 dB.

Figure 6B:
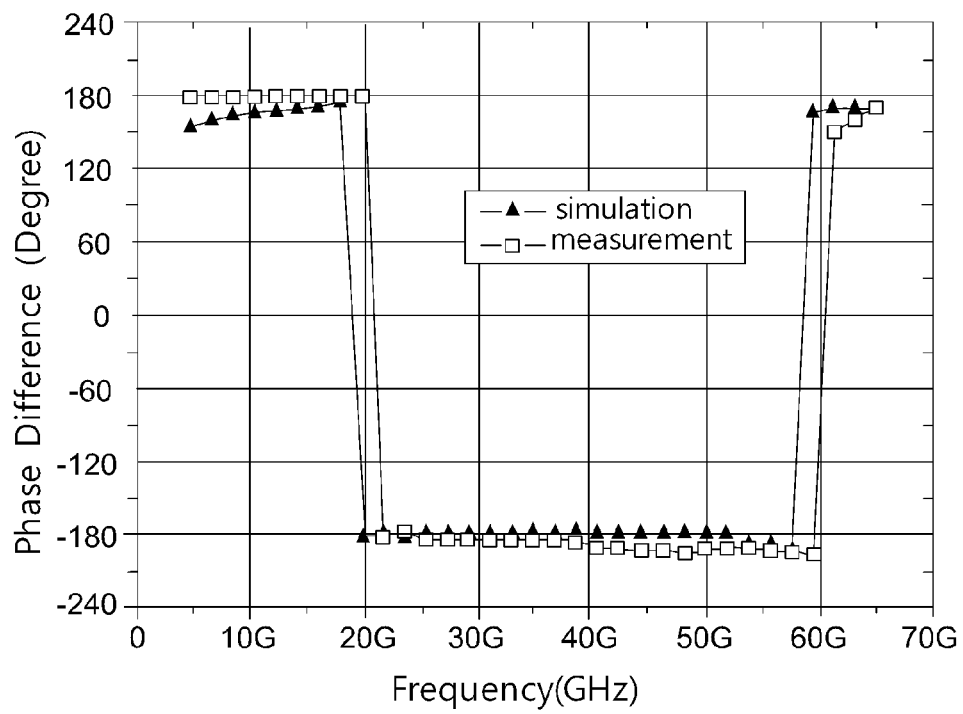
FIG. 6B is a graph showing the phase difference versus RF characteristics of each balun circuit unit utilized by the invention.

Further, FIG. 6B is a graph showing the phase difference versus RF characteristics of each of the two balun circuit units (100, 200) resulted from both circuit simulation and actual testing. It can be seen from this graph that in the frequency range from 20 GHz to 55 GHz, the simulation result shows an output signal phase difference of from −178° to −187°, while the actual testing shows an output signal phase difference of from −179° to −192°, which indicates that the output signal phase difference is about 180°±10°.

Figure 7A:
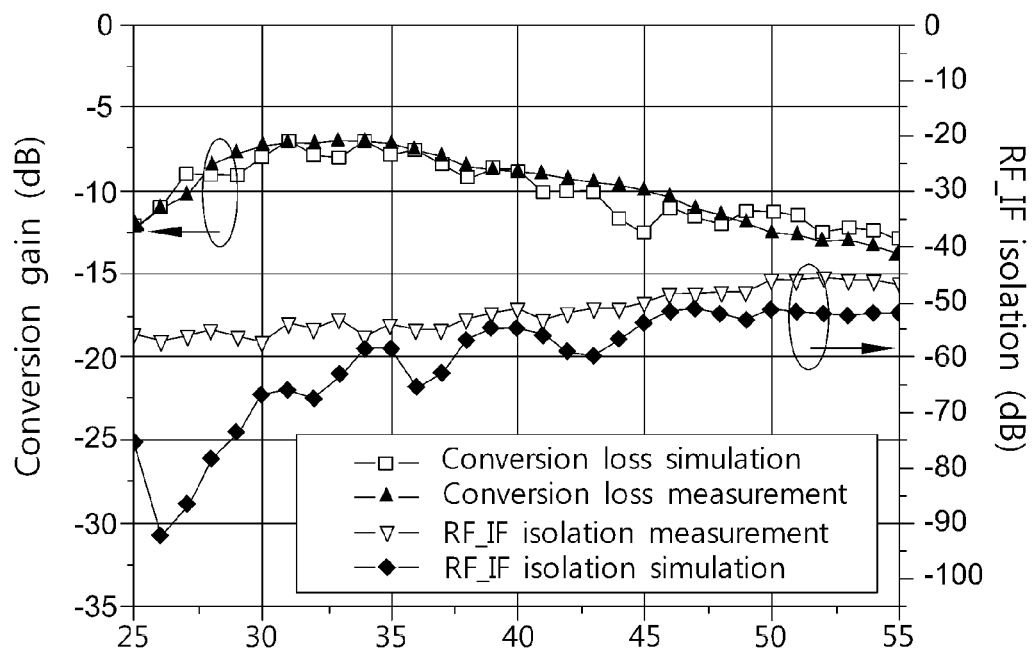
FIG. 7A is a graph showing the conversion gain versus RF characteristics of the invention.

FIG. 7A is a graph showing the conversion gain versus RF characteristics of the miniaturized dual-balanced mixer circuit of the invention 10. It can be seen from this graph that the miniaturized dual-balanced mixer circuit of the invention 10 is capable of providing a conversion loss of from −7 dB to −12 dB.

Figure 7B:
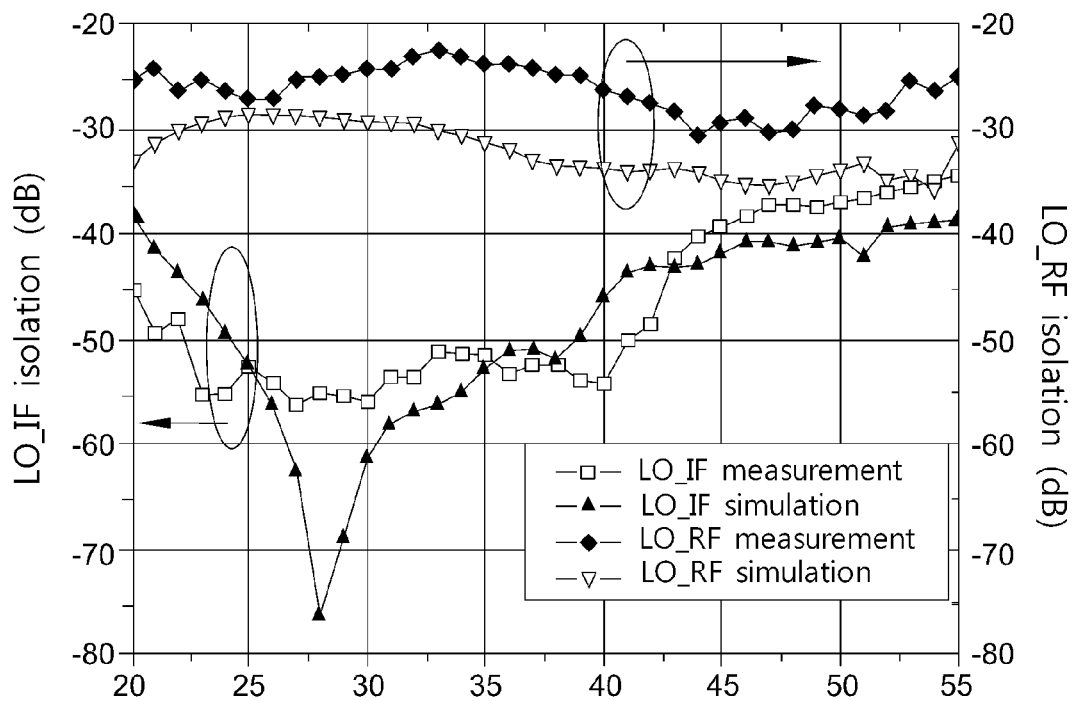
FIG. 7B is a graph showing the LO-to-RF and IF-to-RF isolation versus RF characteristics of the invention.

FIG. 7B is a graph showing the LO-to-RF and LO-to-IF isolation versus RF characteristics of the miniaturized dual-balanced mixer circuit of the invention 10. It can be seen from this graph that the miniaturized dual-balanced mixer circuit of the invention 10 is capable of providing a level of LO-to-RF and LO-to-IF isolation greater than 20 dB.

ADVANTAGE OF THE INVENTION

Compared to the conventional star-type DBM, the miniaturized dual-balanced mixer circuit of the invention 10 is more advantageous to use in that the invention requires a smaller layout space in IC implementation owing to the use of a double spiral layout architecture for the layout of the 2 balun circuit units (100, 200). Specifically speaking, the conventional star-type DBM requires a layout area of about the square of (λ/2), whereas the invention only requires a layout area of about the square of (λ/7), i.e., only about 15% of the layout area of the conventional star-type DBM. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and functional equivalent arrangements. The scope of the claims, therefore, should be accorded the broadest interpretation so as to encompass all such modifications and functional equivalent arrangements.

What is claimed is:

1. A miniaturized dual-balanced mixer circuit of the type having a first input port for receiving a first input signal, a second input port for receiving a second input signal, and an output port for outputting an intermediate-frequency signal which is a mixed version of the first input signal and the second input signal; the miniaturized dual-balanced mixer circuit comprising:

a first balun circuit unit, which has a single-port input interface and a four-port output interface, wherein the single-port input interface is connected to the first input port for receiving the first input signal, while the four-port output interface is used for outputting four balance-to-unbalance transformed signals;

a second balun circuit unit, which has a single-port input interface and a four-port output interface, wherein the single-port input interface is connected to the second input port for receiving the second input signal, while the four-port output interface is used for outputting four balance-to-unbalance transformed signals; and a frequency-mixing circuit unit, which is capable of generating the intermediate-frequency signal by mixing the output balance-to-unbalance transformed signals from the first balun circuit unit and the second balun circuit unit; wherein in integrated circuit layout, the first balun circuit unit and the second balun circuit unit are each constructed on a plurality of distributed transmission lines whose layout patterns are based on a double spiral topology.

2. The miniaturized dual-balanced mixer circuit of claim 1, wherein the first input signal is a carrier signal in the frequency range from 25 GHz to 45 GHz.

3. The miniaturized dual-balanced mixer circuit of claim 1, wherein the first balun circuit unit is constructed on a multilayer substrate.

4. The miniaturized dual-balanced mixer circuit of claim 3, wherein the multilayer substrate is a double-layer substrate for layout of the transmission lines in two layers for construction of a dual Marchand balun circuit architecture.

5. The miniaturized dual-balanced mixer circuit of claim 4, wherein the transmission lines include quarter-wavelength microstrip lines.

6. The miniaturized dual-balanced mixer circuit of claim 3, wherein the multilayer substrate is a double-layer GaAs substrate used for 0.15 μm pHEMT (Pseudomorphic High Electron Mobility Transistor) fabrication.

7. The miniaturized dual-balanced mixer circuit of claim 1, wherein the second balun circuit unit is constructed on a multilayer substrate.

8. The miniaturized dual-balanced mixer circuit of claim 7, wherein the multilayer substrate is a double-layer substrate for layout of a plurality of transmission lines arranged to form a dual Marchand balun circuit architecture.

9. The miniaturized dual-balanced mixer circuit of claim 8, wherein the transmission lines include quarter-wavelength microstrip lines.

10. The miniaturized dual-balanced mixer circuit of claim 7, wherein the multilayer substrate is a double-layer GaAs substrate used for 0.15 μm pHEMT (Pseudomorphic High Electron Mobility Transistor) fabrication.

11. The miniaturized dual-balanced mixer circuit of claim 1, wherein the frequency-mixing circuit unit is based on a diode-switched circuit architecture.

12. The miniaturized dual-balanced mixer circuit of claim 1, wherein the frequency-mixing circuit unit is based on a transistor-switched circuit architecture.

13. A miniaturized dual-balanced mixer circuit having a first input port for receiving a first input signal, a second input port for receiving a second input signal, and an output port for outputting an intermediate-frequency signal which is a mixed version of the first input signal and the second input signal; the miniaturized dual-balanced mixer circuit comprising:

a first balun circuit unit, which has a single-port input interface and a four-port output interface, wherein the single-port input interface is connected to the first input port for receiving the first input signal, while the four-port output interface is used for outputting four balance-to-unbalance transformed signals;

a second balun circuit unit, which has a single-port input interface and a four-port output interface, wherein the single-port input interface is connected to the second input port for receiving the second input signal, while the four-port output interface is used for outputting four balance-to-unbalance transformed signals; and a frequency-mixing circuit unit of a diode-switched type, which is capable of generating the intermediate-frequency signal by mixing the output balance-to-unbalance transformed signals from the first balun circuit unit and the second balun circuit unit; wherein in integrated circuit layout, the first balun circuit unit and the second balun circuit unit are each constructed on a plurality of distributed transmission lines whose layout patterns are based on a double spiral topology.

14. The miniaturized dual-balanced mixer circuit of claim 13, wherein the first input signal is a carrier signal in the frequency range from 25 GHz to 45 GHz.

15. The miniaturized dual-balanced mixer circuit of claim 13, wherein the first balun circuit unit and the second balun circuit unit are each constructed on a multilayer substrate for layout of the transmission lines in two layers for construction of a dual Marchand balun circuit architecture.

16. The miniaturized dual-balanced mixer circuit of claim 15, wherein the transmission lines include quarter-wavelength microstrip lines.

17. The miniaturized dual-balanced mixer circuit of claim 15, wherein the multilayer substrate is a double-layer GaAs substrate used for 0.15 μm pHEMT (Pseudomorphic High Electron Mobility Transistor) fabrication.

18. A miniaturized dual-balanced mixer circuit having a first input port for receiving a first input signal, a second input port for receiving a second input signal, and an output port for outputting an intermediate-frequency signal which is a mixed version of the first input signal and the second input signal; the miniaturized dual-balanced mixer circuit comprising:

a first balun circuit unit, which has a single-port input interface and a four-port output interface, wherein the single-port input interface is connected to the first input port for receiving the first input signal, while the four-port output interface is used for outputting four balance-to-unbalance transformed signals;

a second balun circuit unit, which has a single-port input interface and a four-port output interface, wherein the single-port input interface is connected to the second input port for receiving the second input signal, while the four-port output interface is used for outputting four balance-to-unbalance transformed signals; and a frequency-mixing circuit unit of a transistor-switched type, which is capable of generating the intermediate-frequency signal by mixing the output balance-to-unbalance transformed signals from the first balun circuit unit and the second balun circuit unit; wherein in integrated circuit layout, the first balun circuit unit and the second balun circuit unit are each constructed on a plurality of distributed transmission lines whose layout patterns are based on a double spiral topology.

19. The miniaturized dual-balanced mixer circuit of claim 18, wherein the first input signal is a carrier signal in the frequency range from 25 GHz to 45 GHz.

20. The miniaturized dual-balanced mixer circuit of claim 18, wherein the first balun circuit unit and the second balun circuit unit are each constructed on a multilayer substrate for layout of the transmission lines in two layers for construction of a dual Marchand balun circuit architecture.

21. The miniaturized dual-balanced mixer circuit of claim 20, wherein the transmission lines include quarter-wavelength microstrip lines.

22. The miniaturized dual-balanced mixer circuit of claim 20, wherein the multilayer substrate is a double-layer GaAs substrate used for 0.15 μm pHEMT (Pseudomorphic High Electron Mobility Transistor) fabrication.

* * * * *